(12) United States Patent
Graf et al.

(10) Patent No.: US 11,181,551 B2
(45) Date of Patent: Nov. 23, 2021

(54) METHOD FOR OPERATING A BATTERY SENSOR, AND BATTERY SENSOR

(71) Applicant: Continental Automotive GmbH, Hannover (DE)

(72) Inventors: Hans-Michael Graf, Frankfurt am Main (DE); Martin Schramme, Frankfurt am Main (DE); Andreas Aumer, Frankfurt am Main (DE); Manfred Frimberger, Frankfurt am Main (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/757,671

(22) PCT Filed: Oct. 19, 2018

(86) PCT No.: PCT/EP2018/078690
§ 371 (c)(1),
(2) Date: Apr. 20, 2020

(87) PCT Pub. No.: WO2019/081365
PCT Pub. Date: May 2, 2019

(65) Prior Publication Data
US 2020/0333376 A1 Oct. 22, 2020

(30) Foreign Application Priority Data

Oct. 24, 2017 (DE) .................... 10 2017 219 016.7

(51) Int. Cl.
*G01R 1/20* (2006.01)
*G01R 31/389* (2019.01)
(Continued)

(52) U.S. Cl.
CPC ......... *G01R 1/203* (2013.01); *G01R 19/0092* (2013.01); *G01R 31/389* (2019.01); *G01R 31/3842* (2019.01); *G01R 35/005* (2013.01)

(58) Field of Classification Search
None
See application file for complete search history.

(56) References Cited

U.S. PATENT DOCUMENTS

2011/0006777 A1* 1/2011 Park .................... B60L 3/0046
324/509

FOREIGN PATENT DOCUMENTS

DE 102016202501 A1 8/2017
DE 102016204941 A1 9/2017
(Continued)

OTHER PUBLICATIONS

German Search Report for German Application No. 10 2017 219 016.7, with partial translation, dated Jun. 13, 2018, 13 pages.
(Continued)

*Primary Examiner* — Jas A Sanghera
(74) *Attorney, Agent, or Firm* — RatnerPrestia (57) ABSTRACT

A method for operating a battery sensor and a battery sensor, including a first and second battery sensor connections, load current connection, current measurement device for recording load current, and first and second measuring resistor elements. The first and second measuring resistor element series connected between the load current connection and the second battery sensor connection, a reference current circuit with at least one reference resistor. The reference resistor in contact with the first battery sensor connection and a contact point between the measuring resistor elements. The electrical resistance of the first resistor element determined by switching on the reference current and recording the voltage drops across the first and second measuring
(Continued)

resistor element and the battery voltage, determining the reference current from the battery voltage quotient and electrical resistance of the reference resistor element, and determining the electrical resistance of the first resistor element from the recorded voltage drops.

17 Claims, 4 Drawing Sheets

(51) Int. Cl.
*G01R 31/3842* (2019.01)
*G01R 19/00* (2006.01)
*G01R 35/00* (2006.01)

(56) References Cited

FOREIGN PATENT DOCUMENTS

| EP | 1378757 A2 | 1/2004 |
|----|------------|--------|
| WO | 2016041658 A1 | 3/2016 |

OTHER PUBLICATIONS

International Search Report and Written Opinion for International Application PCT/EP2018/078690, dated Feb. 13, 2019, 12 pages.

* cited by examiner

METHOD FOR OPERATING A BATTERY SENSOR, AND BATTERY SENSOR

CROSS REFERENCE TO RELATED APPLICATIONS

This application is the U.S. National Phase Application of PCT International Application No. PCT/EP2018/078690, filed Oct. 19, 2018, which claims priority to German Patent Application No. 10 2017 219 016.7, filed Oct. 24, 2017, the contents of such applications being incorporated by reference herein.

FIELD OF THE INVENTION

The invention relates to a method for operating a battery sensor and to a battery sensor.

BACKGROUND OF THE INVENTION

Such battery sensors in particular contain devices for measuring the battery voltage, the battery current drawn or output by the battery and the ambient temperature of the battery. The battery sensor usually also includes a microcontroller that buffer-stores and filters these measured data and uses them to calculate further battery variables, for example the state of charge or the internal resistance of the battery.

In order to measure the load current, designs from the prior art use highly accurate resistors or sensors for measuring the magnetic field strength. One disadvantage of the previous designs is in particular the high costs, in particular for the manufacture of resistive materials, which have more or less constant resistance values in a conventional temperature range from −40° C. to 105° C. One example of such a material is a copper-nickel-manganese alloy.

There have been approaches for some time to replacing a highly precise resistor as a measuring resistor, also referred to as a shunt resistor, with less expensive components. One possibility is to recalibrate a shunt resistor again and again over the service life of the battery sensor.

Document EP 1378757 A2, incorporated herein by reference, proposes to connect a reference resistor in parallel with the measuring resistor and to evaluate the electrical variable occurring in each case at the measuring resistor and at the reference resistor.

Document WO 2016/041658 A1, incorporated herein by reference, discloses a calibration method for a battery sensor by impressing a known reference current into a measuring resistor and recording a calibration voltage drop.

However, it has been found that constant recalibration is difficult, including when simultaneously measuring the high and greatly time-varying currents occurring in the motor vehicle under the prevailing boundary conditions, in particular of a desired low current consumption of the sensor, since the reference current to be applied for calibration should be chosen to be small and should be applied only briefly.

SUMMARY OF THE INVENTION

An aspect of the invention is a method for operating a battery sensor that is able to be carried out with little effort or with a simpler construction of the battery sensor in comparison with known designs, and to provide a battery sensor for performing this method, wherein the battery sensor has a simpler and less expensive structure.

Therefore, what is provided is a method for operating a battery sensor, wherein the battery sensor comprises at least a first battery sensor connection and a second battery sensor connection, in particular for connection to a battery, and a load current connection, a current measurement device for recording the load current, with a first measuring resistor element and a second measuring resistor element, wherein the first and the second measuring resistor element are connected in series between the load current connection and the second battery sensor connection, and a reference current circuit with at least one reference resistor, wherein the reference resistor is in contact with the first battery sensor connection and a contact point provided between the measuring resistor elements.

The electrical resistance of the first resistor element is determined by
  switching on the reference current and recording the voltage drops across the first and the second measuring resistor element and the battery voltage,
  determining the reference current from the quotient of the battery voltage and the electrical resistance of the reference resistor element, and
  determining the electrical resistance of the first measuring resistor element from the recorded voltage drops, the reference current and at least one correction factor that characterizes the relationship between the electrical resistance of the first measuring resistor element and the electrical resistance of the second measuring resistor element.

In order to achieve the object, what is furthermore provided is a battery sensor for determining a battery state of a battery, in particular a vehicle battery, comprising at least a first battery sensor connection and a second battery sensor connection, in particular for connection to a battery, and a load current connection, a voltage measurement device for recording the voltage at the first battery sensor connection, a current measurement device for recording the load current, with a first measuring resistor element and a second measuring resistor element, wherein the first and the second measuring resistor element are connected in series between the load current connection and the second battery sensor connection, and wherein a first and a second voltage measurement apparatus for recording the respective voltage drop across the first and the second measuring resistor are provided, a reference current circuit with at least one reference resistor, wherein the reference resistor is in contact with the first battery sensor connection and a contact point provided between the measuring resistor elements, and a controller for determining the load current and/or a battery state.

The load current and/or the battery state are determined in particular using the method described above and explained in detail below.

An input for the battery voltage, the two voltage drops across the measuring resistor elements, for a temperature sensor and for determining the magnitude of the reference current is in each case usually required on a controller or evaluation unit. At least five inputs are thus preferably required in order to record all of the battery parameters that are required for determining the battery state.

Expediently, in each case only three signals are required at the same time, wherein the signals are changed for defined time periods or measuring intervals. The controller therefore requires only three inputs. This is advantageous in particular if the signals are to be digitized for further processing or for determining the battery parameters, since the number of required analog-to-digital converters may thereby likewise be reduced to three.

During regular operation, the load current is preferably determined by recording the voltage drops across the measuring resistor elements. The load current may be determined using the ohmic principle with the known electrical resistances of the measuring resistor elements. For this purpose, the signals of the first and optionally the signals of the second voltage measuring apparatus are output to the controller.

In order to expediently calibrate the measuring resistor elements, the reference current is applied to the contact point between the first and the second measuring resistor element, wherein the reference current is driven essentially by the first measuring resistor element. The exact electrical resistance of the first measuring resistor element may be determined from the change in the measured voltage drops across the measuring resistor elements or by measuring the voltage drop across the first measuring resistor element and a known or previously determined proportionality between the electrical resistances of the measuring resistor elements, and the electrical resistance of the second measuring resistor element may also be determined from the known proportionality. The proportionality between the measuring resistor elements is represented for example by correction factors, where: $U1=U2*\alpha+\beta$.

Usually or by way of example, the reference current is provided with high accuracy or the magnitude of the measured current is recorded, wherein an additional measurement apparatus and an additional analog-to-digital converter are required. According to the method described above, the measured current is preferably determined from the quotient of the simultaneously recorded battery current and the known electrical resistance of the reference resistor.

At the same time, the battery voltage is preferably continuously recorded by the voltage measurement device. The reference current circuit is in direct contact with the battery sensor connection, at which the battery voltage is also recorded. That is to say, the reference current or the voltage drop across the reference resistor is directly dependent on the battery voltage, in particular proportional thereto. Since the battery voltage is recorded continuously, no separate voltage measurement at the reference resistor is thus required. The reference current corresponds to the quotient of the battery voltage and the electrical resistance of the reference resistor.

In order to determine the reference current and in order thus to determine the exact electrical resistance of the first resistor element, a separate recording apparatus and a separate input for the controller are thus expediently not required. The reference current and the exact electrical resistance of the first resistor element are determined from the three signals present at the controller.

Expediently, no additional switching elements, in particular no further analog-to-digital converters, are required.

Furthermore, no switching elements for regulating the reference current are preferably required, since this reference current is determined using the method described above. No switching elements, in particular for regulating the reference current, are thus provided between the battery sensor connection and the reference current circuit. Only one switch for switching the reference current on and off is required.

The reference current circuit is preferably designed such that it does not comprise a current regulator or that no additional electrical component is provided between the battery sensor connection and the reference current circuit.

It is pointed out that the electrical resistance of the reference resistor is preferably a multiple greater than the electrical resistances of the measuring resistor elements, preferably at least by a factor of 1000. The voltage drop of the reference current across the measuring resistor elements is therefore significantly less than the voltage drop of the reference current across the reference resistor, such that this is able to be ignored in the calculation of the reference current.

In principle, a plurality of first and a plurality of second measuring resistor elements may also be provided, wherein the first and the second voltage measurement apparatuses are respectively able to record either the voltage drops across all of the first and all of the second measuring resistor elements and/or a separate voltage measurement apparatus may be provided for each measuring resistor element.

By way of the method described above, the load current and the battery voltage may expediently be determined using only three analog-to-digital converters, wherein the load current measurement is highly precise due to the continuous recalibration of the measuring resistor. This is particularly advantageous since available integrated circuits for use in battery sensors usually contain at most three analog-to-digital converters.

The load current is preferably determined by switching off the reference current and recording the voltage drop across the first measuring resistor element. In principle, the voltage drops across both measuring resistor elements may be used for the load current measurement. By virtue of the method described above, it is possible to accurately determine the electrical resistances of both measuring resistor elements, such that it is possible to perform a highly accurate current measurement. A reliable and accurate current measurement is however also possible if only one voltage drop and the accurately determined electrical resistance of the corresponding measuring resistor element are known. The input of the controller, by way of which the respective other voltage drop is recorded, may instead be used to record another battery parameter. Continuous current measurement, continuous recording of the battery voltage and recording of additional battery parameters is thus possible, wherein only three inputs are required on the controller. In particular if the signals are to be digitized by the controller prior to recording, the number of analog-to-digital converters may thereby be reduced. Only three analog-to-digital converters are required at or upstream of the three inputs of the controller. The load current is preferably determined continuously, that is to say without interruption, from the voltage drop across the first measuring resistor element.

Preferably, at the same time as the load current is determined from the voltage drop across the first resistor element, the battery state is determined by recording the battery voltage, the load current is determined from the voltage drop across the first measuring resistor element, and a battery parameter is recorded using a sensor, in particular a temperature is recorded using a temperature sensor.

As explained above, only three inputs are preferably required on the controller in order to determine the battery state and in order to accurately determine the electrical resistances of the measuring resistor elements, that is to say only three signals need to be recorded and processed by the controller, regardless of which function is currently being performed.

The at least one correction factor is determined for example from the voltage drops and/or the profiles of the voltage drops of the load current across the first and the second measuring resistor element when the reference current is switched off. That is to say, only the load current is applied to the measuring resistor elements and the voltage drops across the first and the second measuring resistor element are recorded respectively by the first and the second voltage measurement apparatus. The at least one correction factor may be determined from the recorded voltage drops. The correction factor may for example represent a linear relationship between measured voltage drops or offset. The at least one correction factor may be used to calculate, from a recorded voltage drop or the determined electrical resistance of one measuring resistor element, the voltage dropping across the other measuring resistor element or the electrical resistance of the other measuring resistor.

In order to completely record the battery state, three steps or three measuring intervals are therefore preferably required. The correction factors are first of all determined in a first time interval, wherein a load current may also be determined from the measured voltage drops. The exact electrical resistances of the measuring resistor elements or at least the exact electrical resistance of the first measuring resistor element are determined in a second time interval. The exact load current and/or the battery state is subsequently determined in a third time interval. The three steps of determining the electrical resistance of the first measuring resistor element, determining the load current or the battery state and/or determining the battery parameter using the sensor are preferably repeated alternately, in particular periodically.

The repetition frequency of the individual time intervals may preferably vary in this case. By way of example, the determination of a temperature, that is to say a battery parameter, or the determination of the correction factors, needs to be performed less frequently, since these change only slowly.

The length of time of the individual time intervals may likewise vary, depending on how quickly and/or accurately the individual parameters are able to or should be determined.

The reference resistor is preferably highly accurate or has only a very small temperature-induced or aging-induced change in electrical resistance. By virtue of the battery voltage and the highly accurate electrical resistance, it is possible to determine the reference current and thus the electrical resistance of the first and the second measuring resistor element with very high accuracy.

However, the reference resistor may also consist of several reference sub-resistors, wherein only one reference sub-resistor has to be highly accurate. By way of example, a highly accurate reference sub-resistor with a low electrical resistance is connected in series with a further reference sub-resistor with lower accuracy and higher resistance. The costs for the highly accurate reference sub-resistor may thereby be reduced since the highly accurate reference sub-resistor does not need to be designed for the entire voltage dropping across the reference resistor. In a method described above, the reference resistor therefore has at least a first reference sub-resistor and a second reference sub-resistor, and the reference resistance is determined by connecting the reference current to the group of measuring resistors, recording a voltage at a voltage tapping point between the reference sub-resistors, recording the battery voltage, determining the division ratio from the recorded voltage and the recorded battery voltage and determining the electrical resistance of the second reference sub-resistor from the division ratio and the known electrical resistance of the first reference sub-resistor.

This preferably means that the—larger—electrical resistance of the second reference sub-resistor and thus the electrical resistance of the reference resistor is determined from the known—relatively small—electrical resistance of the highly accurate reference sub-resistor. It is not necessary for the entire voltage drop across the reference resistor to take place across a highly accurate resistor.

This step may likewise be repeated periodically in a further measuring interval. It is once again pointed out that only three signals are required to calibrate the reference resistor.

The voltages, the voltage drops and the battery parameters are preferably recorded using three analog-to-digital converters, wherein a first analog-to-digital converter for recording the voltage drop across the first measuring resistor element, a second analog-to-digital converter for selectively recording the voltage drop across the second measuring resistor element or the battery parameter of the at least one sensor and a third analog-to-digital converter for recording the battery voltage are provided.

Usually or by way of example, a separate analog-to-digital converter is required in each case to detect each voltage drop, for the voltage drops across the measuring resistor elements and across the reference resistor. In addition, an analog-to-digital converter is required in each case to record the battery voltage and further sensor data, for example from a temperature sensor. This is necessary in particular in order to ensure uninterrupted current measurement of the load current and uninterrupted recording of the battery voltage. This is necessary in order to ensure constant and therefore reliable determination of the battery state. By virtue of the method described above, all of the data are able to be recorded and the battery state is able to be determined using only three analog-to-digital converters. In this case, an analog-to-digital converter is used to record the battery voltage and at least one digital converter is used to record the load current. The second analog-to-digital converter is used alternately to determine the correction factors, to record the load current or to record another signal, for example a temperature signal. The signals are additionally used several times. The recorded battery current is thus also for example used to determine the reference current or to calibrate the reference resistor.

Optionally, the same input signals may preferably be applied to two analog-to-digital converters in order to calibrate or compensate them. By way of example, a calibration factor of the second or the third analog-to-digital converter is determined by applying the same voltage, the same voltage drop and/or the same parameter of a sensor to the second and the third analog-to-digital converter.

By way of example, the battery voltage is recorded simultaneously by the second and the third analog-to-digital converter. The values may be compared with one another and a calibration factor for the second or the third analog-to-digital converter may be determined. For this purpose, a voltage divider may optionally be provided in order to divide the battery voltage. The advantage of this calibration method is that the battery voltage measurement may be continued without interruption and the method may likewise be carried out using the three existing signal inputs.

As an alternative or preferably in addition, a voltage applied at a voltage tapping point between the first reference sub-resistor and the second reference sub-resistor of the reference resistor may be recorded using the second and the third analog-to-digital converter in order to determine at least one calibration factor. No voltage divider is for example required for this purpose, such that calibration is possible with simple means without additional electronic components.

The voltage measurement device and/or the first and the second voltage measurement apparatuses preferably have an analog-to-digital converter.

At least one sensor for recording a battery parameter may be provided and a changeover switch, in particular a multiplexer, for switching between a signal of the voltage measurement apparatus and a signal of the sensor may be assigned to the second voltage measurement apparatus, wherein the changeover switch is in particular provided upstream of an analog-to-digital converter of the second voltage measurement apparatus. The changeover switch enables the analog-to-digital converter to record several different signals, such that multiple use of the analog-to-digital converter is possible. The number of analog-to-digital converters may thus be reduced to three, in particular when the method described above is performed. The battery sensor preferably has a total of only three analog-to-digital converters.

A changeover switch, in particular a multiplexer, is understood in particular to mean a selection circuit by way of which one of a number of input signals may be selected and switched through to the output.

The reference current circuit has for example a switch element arranged in series with the reference resistor in order to be able to switch the reference current on or off.

The reference resistor may preferably have at least two reference resistor elements arranged in series, wherein a voltage tapping point is provided between the reference resistor elements. The voltage measurement device may be assigned a changeover switch for selectively recording the battery voltage or the voltage present at the voltage tapping point, wherein the changeover switch is in particular provided upstream of an analog-to-digital converter of the voltage measurement device. As an alternative or in addition, the second voltage measurement apparatus may be assigned a changeover switch for selectively recording the voltage drop across the second measuring resistor element and the voltage present at the voltage tapping point, wherein the changeover switch is in particular provided upstream of an analog-to-digital converter of the second voltage measurement apparatus. The first or the second reference sub-resistor is preferably a highly accurate resistor. By virtue of this arrangement, as described above, it is possible to determine the reference resistance if a reference sub-resistance is known. Furthermore, at least one calibration factor of the second and/or the third analog-to-digital converter may be determined.

The changeover switches are preferably multiplexers that are arranged upstream of the respective analog-to-digital converter. The changeover switch may also be designed for more than two input signals, for example for a voltage drop signal and a plurality of sensor signals, for example temperature signals. Regardless of the number of sensors, no more than three analog-to-digital converters are thus required, or the entire determination of the battery state may be performed using three analog-to-digital converters.

In order to be able to expediently record the battery voltage using the second and the third analog-to-digital converter, for example in order to determine a calibration factor, a voltage divider for the battery voltage may be provided and the second voltage measurement apparatus is assigned a changeover switch for selectively recording the voltage drop across the second measuring resistor element and the battery voltage present at the first battery sensor connection, wherein the changeover switch is in particular provided upstream of an analog-to-digital converter of the second voltage measurement apparatus.

The first and the second measuring resistor element may each be designed as parts, in particular as measurement areas and/or measurement sections, of a single-piece load resistor unit.

Since the electrical resistances of the measuring resistors are able to be determined highly accurately using the preferred method described above or the preferred battery sensor described above, it is not necessary to use a material that has only a low temperature dependency and/or a low aging behavior. The electrical resistors are adjusted continuously during operation such that a highly accurate load current measurement is performed regardless of the material of the measuring resistors.

The load resistor unit, preferably consisting of the single-piece load resistor unit, as well as the battery terminal and the ground connection, may also be formed as a single piece, in particular as a stamped and bent part.

The measured voltage drops, voltages and signals may also for example be amplified. For this purpose, there may be provision for amplifier circuits that are provided in particular upstream of the analog-to-digital converter and/or upstream of the changeover switch. The amplifiers or the gain factors are in this case preferably designed such that the magnitude of the input signals for the changeover switches and/or the analog-to-digital converters or the signals for the controller are in a similar range.

Optionally, a fault value for the load current may be calculated based on the reference current in order to estimate the reliability of the determined load current.

The controller may in particular have processor means and storage means, wherein the storage means store program code upon whose execution the processor means execute a method according to an aspect of the invention or behave accordingly.

BRIEF DESCRIPTION OF THE DRAWINGS

Further features and advantages will be gathered by a person skilled in the art from the exemplary embodiments described below with reference to the appended drawing, in which, in each case schematically.

DETAILED DESCRIPTION OF THE PREFERRED EMBODIMENTS

Further explanations of aspects of the invention are given below, in which case this is used, on the one hand, to explain the function and, on the other hand, the features described herein may also be combined in any desired manner with features described elsewhere. They may likewise be combined with one another and may constitute aspects essential to the invention separately or in combination.

Figure 1:
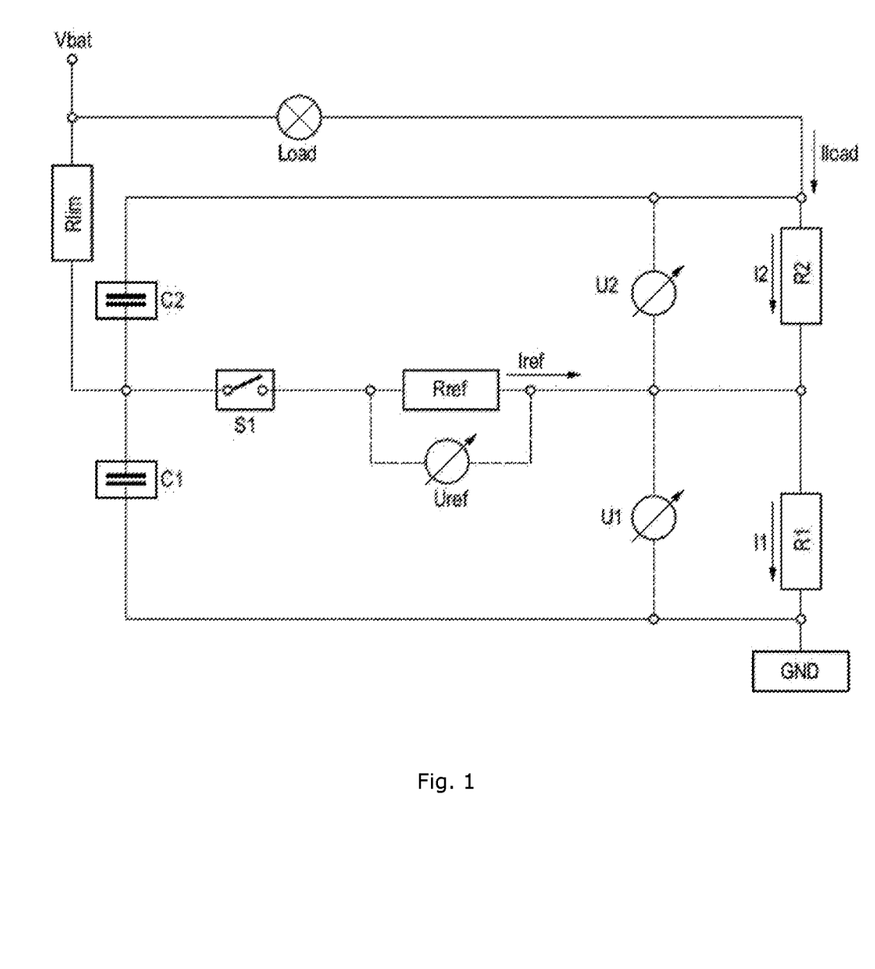
FIG. 1 shows a battery sensor from the prior art.

For this purpose, reference is made first of all to FIG. 1.

FIG. 1 shows a battery sensor from the prior art, by way of which it is possible to perform a calibration method. However, three A-to-D converters U1, U2 and Uref are required, none of which allow an uninterrupted measurement of Vbat.

The group of measuring resistors has a first measuring resistor element R1 and a second measuring resistor element R2, via which a time-varying load current Iload is channeled. This load current Iload initially comes from a battery which is depicted, in terms of voltage, as Vbat in FIG. 1. The load current Iload also flows via a load which is generally referred to as Load and is only schematically illustrated here and may comprise typical electrical components of a motor vehicle, for example a starter motor, a vehicle light or electronic components as well as a generator.

A first voltmeter U1 is arranged across the first measuring resistor element R1. A second voltmeter U2 is arranged across the second measuring resistor element R2. These are designed to measure respective voltage drops across the two measuring resistors R1, R2 when a current I1, I2 is respectively flowing through. Since the resistor elements R1, R2 are arranged in series, I1, I2 each correspond to the load current Iload.

A first capacitor C1 and a second capacitor C2 are used as current sources for a reference current Iref and are directly charged from the vehicle battery via a series resistor Rlim. The load current Iload is generated from the battery Vbat via the load and flows to ground GND via the resistor network of the measuring resistors R1, R2.

The two capacitors C1, C2 are connected to a point between the first measuring resistor and the second measuring resistor via a switch S1 and a reference resistor Rref. The two voltmeters U1, U2 are also connected to this point. A further voltmeter Uref is arranged across the reference resistor Rref and measures a voltage dropped across the reference resistor Rref when a reference current Iref is flowing through. As a result of the switch S1 being closed, a reference current Iref is therefore fed into the resistor network comprising the measuring resistors R1, R2 in addition to the load current Iload, wherein the first capacitor C1 is substantially discharged via the first measuring resistor R1 and the second capacitor C2 is substantially discharged via the second measuring resistor R2. This consequently produces two calibration partial currents, namely a first calibration partial current Iref,1 and a second calibration partial current Iref,2, wherein the first calibration partial current Iref,1 flows through the first measuring resistor R1 and the second calibration partial current Iref,2 flows through the second measuring resistor R2. The two calibration partial currents Iref,1 and Iref,2 have mathematical signs which are opposite across the two measuring resistors R1, R2, whereas their sum Iref flows through the reference resistor Rref and may be measured using a voltage measurement, as already described.

The voltmeters U1, U2 for measuring the voltages dropped across the two measuring resistors R1, R2 are not explained in any further detail in the present case. The voltmeters U1, U2 typically each have at least one amplifier, usually with a variable gain factor, and each have an analog-to-digital converter.

An arithmetic unit, for example an electronic control device which may be in the form of a microcontroller, for example, is not depicted in FIG. 1. Such an electronic control device may have for example processor means and storage means, wherein the storage means store program code upon whose execution the processor means execute a method according to an aspect of the invention. In particular, the processor means may in this case calculate the load current Iload according to the formulas mentioned above. The arithmetic unit or the electronic control device may preferably also have an interface for reading in the voltages U1, U2, Uref and an interface for controlling the switch S1.

It should be mentioned that, instead of the capacitors C1, C2, any desired other type of current source may be used. For example, it is possible to use DC/DC converters, a direct connection to the positive pole of a battery (with or without series resistor Rlim), in-phase regulators, regulated precision current sources (in particular with omission of the Iref measurement via Rref) or else other suitable embodiments.

When switch S1 is closed, that is to say when the reference current is applied, this results in the following solvable system of equations for the voltages at the measuring resistor elements R1 R2:

$$U_m = (I_{load,i} + I_{ref,m}) * R_m * g_m$$

$$U_n = (I_{load,i} + I_{ref,n}) * R_n * g_n$$

In this case
- $U_m$, $U_n$ are the measured voltage drops across each of the measuring resistor elements, where in this case m is 1 and n is 2,
- $R_m$, $R_n$ are the (unknown) electrical resistances of the measuring resistor elements across which the voltage drops $U_m$, $U_n$ are measured. The measuring resistor elements may in turn consist of further measuring resistors connected in series or in parallel,
- $g_m$, $g_n$ are the (erroneous) gain factors of the measuring devices for the voltages $U_m$, $U_n$,
- $I_{load,i}$ is the load current to be measured or a part of this load current which flows via the measuring resistors in the group of measuring resistors used to measure the calibration voltages $U_m$, $U_n$,
- $I_{ref,m}$ and $I_{ref,n}$ are applied calibration partial currents which flow via the measuring resistors $R_m$, $R_n$ in the group of measuring resistors used to measure the calibration voltages $U_m$, $U_n$, wherein $I_{ref,m}$ and $I_{ref,n}$ flow in different directions based on $I_{load,i}$.

In particular, the reference partial currents or the reference current is/are periodically applied, for example with a period duration of between 10 ms and 100 ms for a duration from a period of between 10 μs and 100 μs. This results in times during which reference currents or parts thereof flow through measuring resistor elements in the group of measuring resistors, that is to say time periods, and times during which no reference currents flow through the group of measuring resistors. At these times, that is to say outside calibration periods, at least some of the equations in the system of equations are simplified as $$U_m = I_{load,i} * R_m * g_m$$

$$U_n = I_{load,i} * R_n * g_n$$

$U_m$, $U_n$ are in this case the voltage drops of the load current across the measuring resistor elements R1, R2.

As an alternative, time-varying reference currents may be applied at times during which reference currents flow, that is to say within calibration periods.

At times during which no calibration currents flow through the network, proportionalities of individual equations of the system of equations (or between measured voltages $U_i$) are advantageously formed, for example in a microcontroller that may be part of a current measurement device or connected thereto. For this purpose, a correction factor α is determined, wherein:

$$U_m = \alpha_{mn} * U_n$$

or $$U_m = \alpha_{mn} * I_{load,i} * R_n * g_n$$

For example, voltage value pairs $U_n(t)$, $U_m(t)$ each measured at the same times t may in each case be stored. These stored value pairs may be evaluated in the microcontroller using linear regression in order to determine the correction factors m, o.

With the calibration currents switched on, it is advantageously now possible to determine that part of the load current to be measured by measuring the voltages $U_m$, $U_n$ $$U_m = \alpha_{mn} * (I_{load,i} + I_{ref,n}) * R_n * g_n + o$$

$$U_n = (I_{Load,i} + I_{ref,n}) * R_n * g_n$$

as follows:

$$\frac{U_m}{\alpha_{mn} * R_n * g_n} = I_{load,i} + I_{ref,m}$$

$$\frac{U_n}{R_n * g_n} = I_{load,i} + I_{ref,n}$$

$$\frac{U_n}{R_n * g_n} - \frac{U_m}{\alpha_{mn} * R_n * g_n} = I_{ref,n} - I_{ref,m}$$

$$\frac{U_n}{(I_{ref,n} - I_{ref,m})} - \frac{U_m}{\alpha_{mn} * (I_{ref,n} - I_{ref,m})} = R_n * g_n$$

$$I_{load,i} = \frac{U_n}{R_n * g_n} - I_{ref,n}$$

The penultimate formula indicates a calculation rule for the second operating parameter.

At times when there is no reference current $I_{ref,m}=0$ and $I_{ref,n}=0$ and the last equation may be used to determine the load current $I_{load}$ to be measured.

With known $R_n$, $g_n$, $\alpha$, $\beta$, the following equation may advantageously be used to determine $I_{load}$:

$$I_{load,i} = \frac{1}{2} * \left( \frac{U_m}{R_m * g_m} + \frac{U_n}{R_n * g_n} - I_{ref,m} - I_{ref,n} \right)$$

From the sum of both equations, it is possible to approximately reverse-calculate $I_{load}$ including for times during which the reference current is switched on:

$$I_{load,i} = \frac{1}{2} * \left( \frac{U_m}{R_m * g_m} + \frac{U_n}{R_n * g_n} - I_{ref,m} - I_{ref,n} \right) = \frac{1}{2} * \left( \frac{U_m}{R_m * g_m} + \frac{U_n}{R_n * g_n} \pm ||I_{ref,m}| - |I_{ref,n}|| \right)$$

An error is produced in this case, in particular when the currents $I_{ref,m}$ and $I_{ref,n}$ differ greatly.

The value $I_{ref,m} - I_{ref,n}$ is known in this case and corresponds to the reference current, that is to say to the sum of the calibration partial currents. The different mathematical signs are taken into account in this case.

The following prerequisites must, in principle, be met to determine the load current:

Firstly: The ratio $\alpha_{mn}$ of two products $R_n * g_n$, $R_m * g_m$ of measuring resistances $R_n$ and $R_m$ and gain factors $g_n$, $g_m$ to one another is intended to be substantially stable over a certain period. This certain period should be considerably longer than the period duration with which the periodically applied calibration currents are switched on and off or are periodically changed.

Secondly: The value of the reference current $I_{ref}=I_{ref,n}-I_{ref,m}=|I_{ref,n}|+|I_{ref,m}|$ should be known exactly at least one time at which $U_n$ and $U_m$ are measured with the reference current applied.

It is Now Pointed that 1) the voltage drop is increased in one measuring resistor and the other is reduced, and 2) the resistance is calculated from the difference between the two measured voltages.

This enables an up-to-date measurement of the resistance. Therefore, the resistance need not be continuously constant. It is possible to use less expensive materials.

The described arrangement and the described method make it possible to determine the load current practically without prior knowledge of the resistor network or the group of measuring resistors and the relative accuracy of the measuring devices used to measure the voltages. As a result, despite the less expensive material, it is even possible to achieve a higher accuracy of the current measurement than in embodiments according to the prior art. This is because substantially both the tolerance of the resistance value of the measuring resistor and the tolerance of the voltage measurement device for the voltage drop were previously included in the tolerance of the measured current value.

Typically, only accurate knowledge of $I_{ref}$ at one time is required with the described apparatus or arrangement. In addition, virtually no demands are imposed on the quality of the current source for $I_{ref}$. Only an accurate measurement of $I_{ref}$ is typically required. This may easily be achieved for example with an accordingly accurate reference resistor $R_{ref}$ and an accurate measurement of the voltage drop across $R_{ref}$. This is because, unlike the measuring resistor for the load current, $R_{ref}$ may have a high resistance of 1 ohm, for example, which needs to be designed only for small reference currents and not for high load currents. As a result of the value of $R_{ref}$ which is accordingly selected to be high, the voltage drop $I_{ref} * R_{ref}$ may also be conveniently measured since there is no need for a complicated amplifier, for example.

It is not shown here that the battery voltage Vbat is additionally recorded.

The battery state of the battery may be determined from the battery voltage Vbat, the load current Iload and, optionally, a recorded battery temperature.

In order to determine the electrical resistances of the resistor elements R1, R2, however, the measurement of the load current Iload is interrupted. For example, the measured value of $I_{load}$ for the calibration time may be formed from mean values of measured values before the calibration time and measured values after the calibration time. Alternatively, it is possible to decide whether the erroneous measured value is used or whether a replacement value is formed. The decision may be made for example on the basis of an instantaneous value of the "symmetry factor" m in comparison with earlier values of m. However, the decision may also be made dependent on the size of the ratio of the error in comparison with the applied load current.

In order to reliably determine the battery state, an uninterrupted current measurement is however required in order to always achieve accurate values of the load current Iload.

Figure 2:
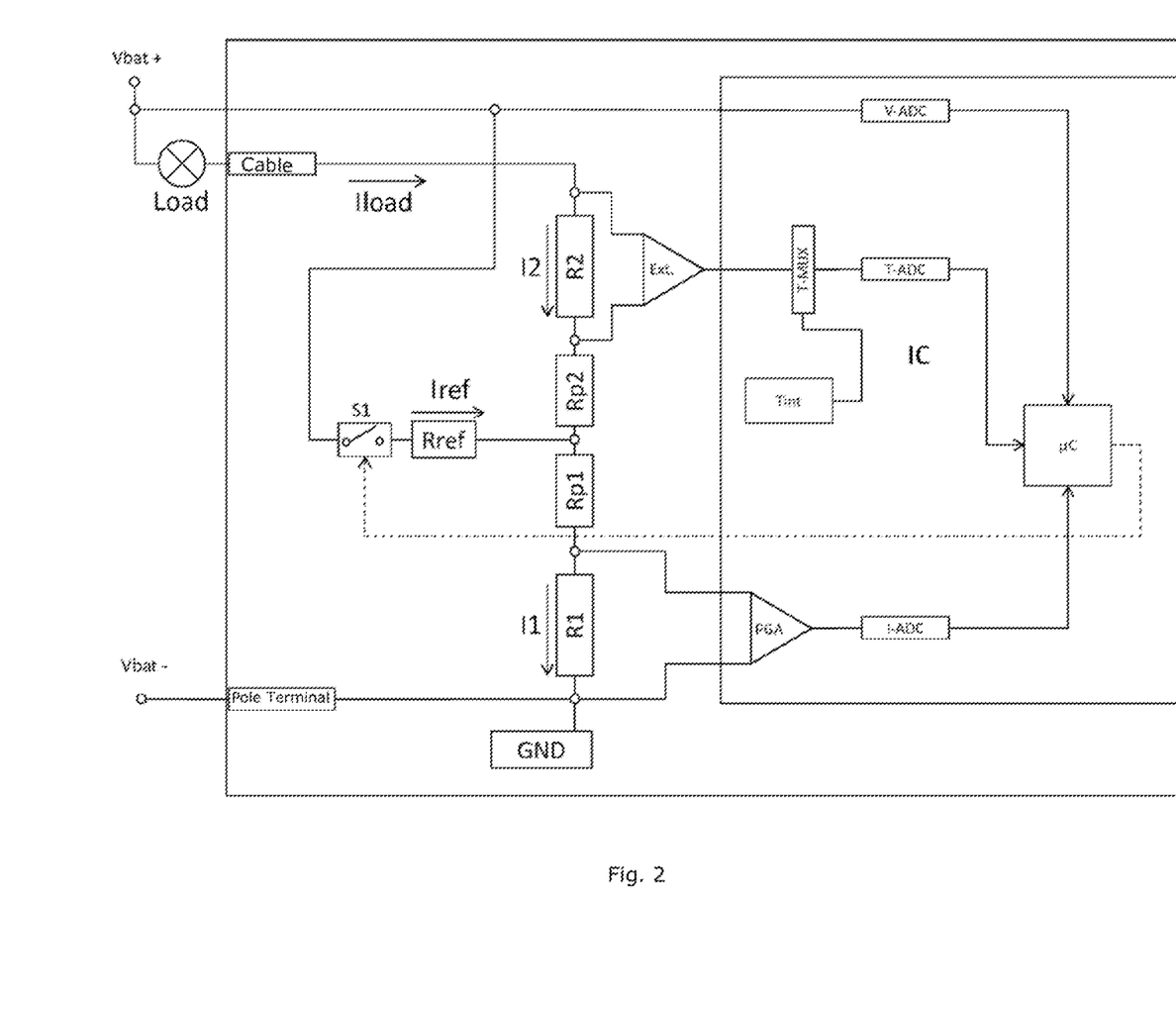
FIG. 2 shows a battery sensor according to a first embodiment of the invention.

FIG. 2 shows a battery sensor according to an aspect of the invention.

The battery sensor has a current measurement device, a voltage measurement device, a reference current circuit and a controller µC.

The voltage measurement device has an analog-to-digital converter V-ADC, which is connected firstly to a first battery sensor connection Vbat+, which is formed here by the positive pole of the battery. The analog-to-digital converter V-ADC is furthermore connected to the controller μC.

The current measurement device has a first and a second measuring resistor element R1, R2 that are each assigned a voltage measurement apparatus. The first voltage measurement apparatus has an amplifier PGA and a first analog-to-digital converter I-ADC, and the second voltage measurement apparatus has an amplifier Ext. and a second analog-to-digital converter T-ADC. The analog-to-digital converters I-ADC, T-ADC are each connected to an input of a controller μC. The measuring resistor elements R1, R2 are connected in series between a load current connection and a second battery sensor connection Vbat-.

A changeover switch T-MUX is provided between the amplifier Ext. and the second analog-to-digital converter T-ADC, to which changeover switch a temperature sensor Tint is connected in addition to the amplifier Ext. By virtue of the changeover switch, either the signal of the amplifier Ext. or the signal of the temperature sensor may be output to the second analog-to-digital converter.

Also provided is a reference current circuit that has a switch S1 and a reference resistor Rref. The switch S1 is arranged in series with the reference resistor. The reference current circuit is connected directly to a first battery sensor connection Vbat+. The reference current Iref is thus directly dependent on the battery voltage.

The reference current circuit is furthermore connected to a contact point between the two measuring resistor elements R1, R2 arranged in series.

Additional resistors Rp2 and Rp1 are shown between the contact point and the measuring resistor elements, which additional resistors may be formed for example by line resistors.

By closing the switch S1, which is controlled for example by the controller μC, the reference current Iref is thus fed into the resistor elements R1, R2 in addition to the load current Iload, wherein the current I1 flowing through the first resistor R1 essentially consists of the current I2 flowing through the second resistor R2 and the reference current Iref.

The method for operating or for using the current sensor preferably has three measuring intervals, the order, frequency and duration of which may be changed as desired, as will be explained below.

In a first measuring interval, the ratio of the measuring resistors is first of all determined, that is to say the correction factors α, β. The switch S1 is open during this measuring interval. The first analog-to-digital converter I-ADC determines the voltage drop U1=R1*I1, amplified by the first amplifier PGA, across the first measuring resistor element R1 and the second analog-to-digital converter T-ADC determines the voltage drop U2=R2*I2, amplified by the second amplifier Ext, across the second measuring resistor element R2.

At the same time, the battery voltage Vbat+ is determined by the third analog-to-digital converter V-ADC.

The battery voltage Vbat+ and the load current Iload determined from the voltage drops U1 and U2 are used in the controller to determine the battery state.

During this first measuring interval, the microcontroller additionally calculates, for example by way of linear regression, the ratio between the first amplified measured voltage U1 and the second amplified measured voltage U2 from at least one measured pair. In this case, for example, a ratio α or preferably a ratio α and an offset β are determined using the following equation: $U1=\alpha_{12}*U2+\beta_{12}$. A measured pair consists in particular of the measurement of the first amplified measured voltage and the second amplified measured voltage.

In a second measuring interval, the switch S1 is closed and a reference current Iref flows through the reference resistor Rref. During this measuring interval, the first analog-to-digital converter I-ADC measures the voltage drop U1 amplified by the first amplifier PGA and the second analog-to-digital converter T-ADC measures the voltage drop U2 amplified by the second amplifier Ext.

At the same time, the battery voltage Vbat is determined by the third analog-to-digital converter V-ADC.

Using the determined first operating parameter and the measured, amplified voltage U2, it is possible to estimate the amplified voltage U1, for example using the following equation:

$$U1est=\alpha_{12}*U2+\beta_{12}.$$

A difference between the measured voltage U1 and the estimate of the voltage U1 may then be determined from:

$$U\text{diff}=U1-U1est.$$

In addition, the reference current may be determined using the known resistance value Rref and the measured battery voltage Vbat, for example using the following equation:

$$Iref=Vbat/Rref.$$

It is pointed out once again in this regard that the electrical resistances of R1 and Rp1 as well as Rp2 and R2 are significantly smaller than the electrical resistance of Rref. The electrical resistances of R1, Rp1, R2, Rp2 are of the order of magnitude of 0.05 . . . 0.1 mOhm. The electrical resistance of Rref is of the order of magnitude of 1 Ohm . . . 10 Ohm in order to keep the calibration current in a range of approx. 1 A. R1 and Rp1 are thus negligibly small compared to Rref (<0.1%), such that the electrical resistances of R1 and rp1 may be ignored in the calculation of the reference current Iref.

The exact electrical resistance of R1 may be determined from the difference between the measured voltage U1 and the estimate of the voltage U1 and the reference current, from as may the electrical resistance of R2, using the determined correction factors, using the formulas:

$$R1=U\text{diff}/Iref;\text{ and }R22=Cal1*\alpha_{12}+\beta.$$

The electrical resistances may then be used to determine the load current from I1=U1/R1 or I2=U2/R2.

A derivation for the formulas mentioned above is also given below. Reference is made to the above description in respect of the meaning of the individual variables.

$$|I_{ref,1}| + |I_{ref,2}| = I_{ref}$$

$$I1 = I_{load} + |I_{ref,1}|$$

$$I2 = I_{lod} - |I_{ref,2}|$$

$$U1 = R1 * g_1 * (I_{load} + |I_{ref,1}|)$$

$$U2 = R2 * g_2 * (I_{load} - |I_{ref,2}|)$$

$$\alpha * R1 * g_1 = R2 * g_2$$

$$U2 = \alpha * R1 * g_1 * (I_{load} - |I_{ref,2}|)$$

$$U1 - \frac{1}{\alpha} * U2 = R1 * g_1 * (|I_{ref,1}| + |I_{ref,2}|)$$

$$R1 * g_1 = \frac{U1 - \frac{1}{\alpha} * U2}{I_{ref}}$$

$$R2 * g_2 = \alpha * R1 * g_1$$

Since the battery voltage Vbat+ is furthermore determined using the third analog-to-digital converter V-ADC and the load current Iload is determined from the voltage drops across R1 and R2, an uninterrupted battery state determination continues to be performed.

In a third measuring interval, the second analog-to-digital converter T-ADC determines the voltage of the internal temperature sensor Tint through an appropriate setting of the first multiplexer T-MUX. During the third measuring interval, the switch S1 is advantageously open, since this ensures that no reference current Iref flows and, accordingly, no measurement of Iref is necessary.

The voltage drop across R1 continues to be recorded during this measuring interval by the first analog-to-digital converter I-ADC, from which voltage drop it is possible to determine the current I1 that corresponds to the load current Iload.

The battery voltage Vbat+ thus continues to be recorded without interruption by the third analog-to-digital converter V-ADC and the load current Iload continues to be recorded without interruption by the first analog-to-digital converter. The temperature is additionally recorded by the second analog-to-digital converter.

The temperature changes only relatively slowly. The correction factors α, β likewise change only slowly. The first and the third measuring interval may thus be carried out less frequently or, if necessary, be shorter than the second measuring interval.

However, the load current Iload and the battery voltage Vbat+ are determined without interruption in each measuring interval.

Figure 3:
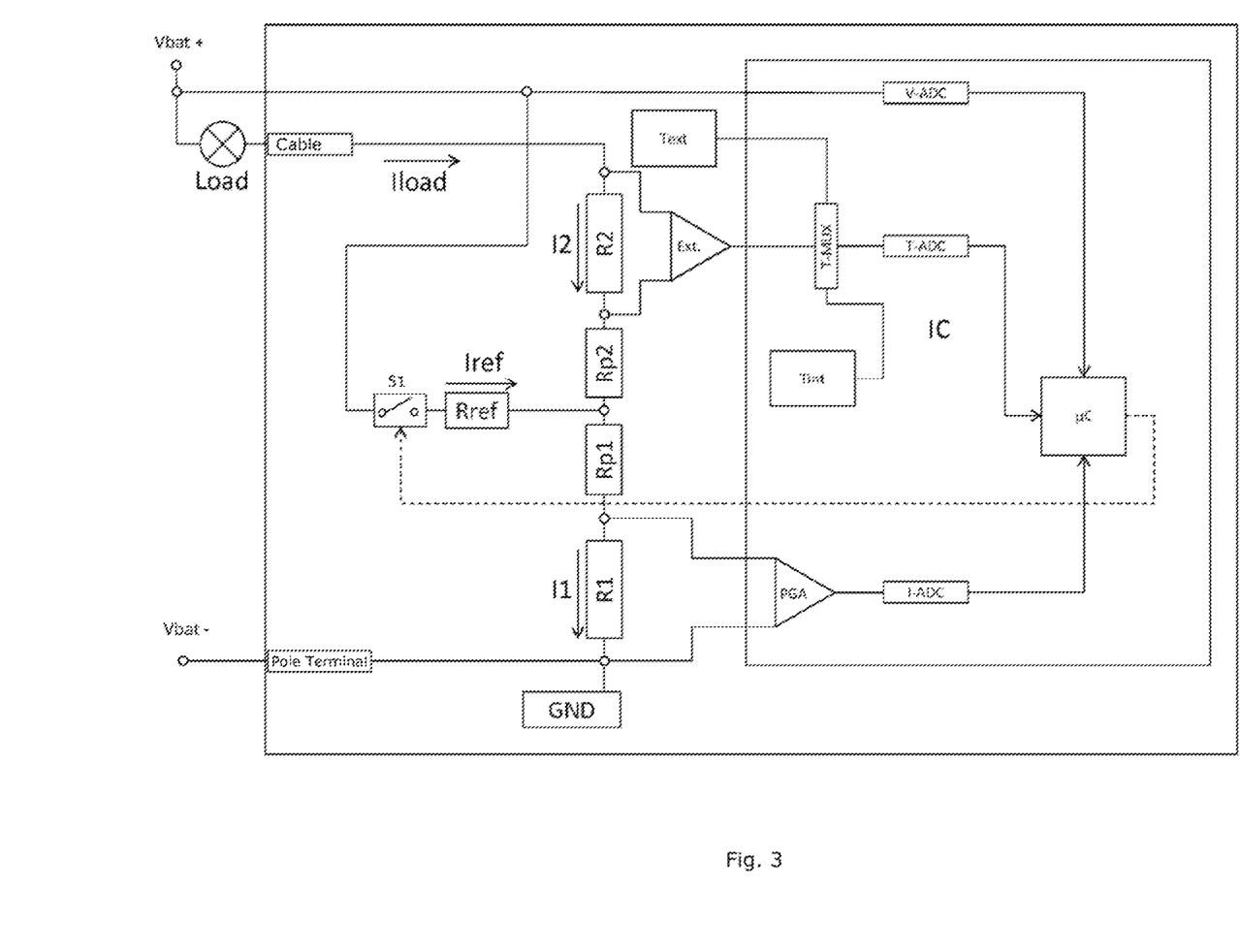
FIG. 3 shows a battery sensor according to a second embodiment of the invention.

FIG. 3 shows a group of measuring resistors with a measuring circuit according to a second exemplary embodiment, in which the first multiplexer T-MUX has a third input.

The third input may be used to select an analog temperature signal from, for example, an additional external temperature sensor Text.

Figure 4:
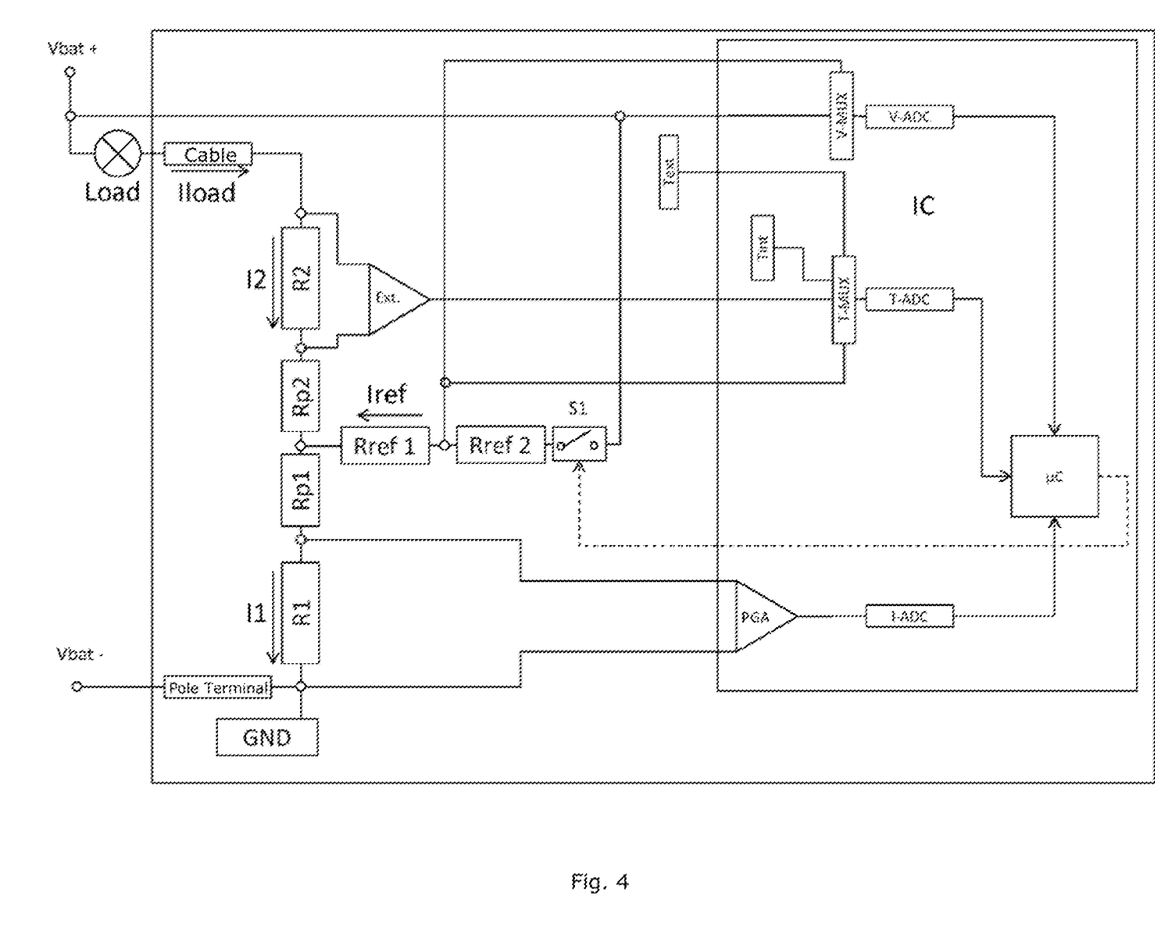
FIG. 4 shows a battery sensor according to a third embodiment of the invention.

FIG. 4 shows a group of measuring resistors with a measuring circuit according to a third exemplary embodiment, in which the reference resistor has a first reference sub-resistor Rref 1 and a second reference sub-resistor Rref 2. A voltage at a voltage tapping point between the first reference sub-resistor Rref 1 and the second reference sub-resistor Rref 2 is fed to a fourth input of the second multiplexer T-ADC and to a further input of the third multiplexer V-MUX, which is connected upstream of the third analog-to-digital converter V-ADC.

Preferably, only one of the reference sub-resistors Rref1, Rref2, specifically the reference sub-resistor Rref 1, is a highly accurate resistor with a low temperature dependency and low aging-induced drift. The electrical resistance of Rref1 is also significantly lower than that of Rref2, such that the highly accurate resistor is significantly smaller and therefore less expensive.

In this embodiment, however, it is necessary to determine the exact electrical resistance of Rref2. This is performed in a fourth measuring interval by determining the voltage at the voltage tapping point between Rref1 and Rref2 using the second analog-to-digital converter T-ADC via an appropriate setting of the second multiplexer T-MUX. The switch S1 is closed during the fourth measuring interval.

Furthermore, the battery voltage Vbat+ is determined using the third analog-to-digital converter V-ADC and the battery current is determined using the first analog-to-digital converter I-ADC and the second analog-to-digital converter T-ADC via an appropriate setting of the multiplexer V-MUX.

The microcontroller calculates the division ratio between Rref1 and the sum of Rref1 and Rref2 using the ratio of the voltage potentials, which are determined by the third analog-to-digital converter V-ADC and the second analog-to-digital converter T-ADC and fed to the microcontroller.

An exact total resistance value for the entire reference resistance (Rref1+Rref2) may be determined from the determined division ratio and from the known electrical resistance of the first reference sub-resistor Rref1.

With this value, it is possible to achieve a more accurate determination of the reference current and thus a more accurate determination of the electrical resistance of the first measuring resistor element R1 in a following second measuring interval.

In a fifth measuring interval, mutual calibration of the first, the second and the third analog-to-digital converter may be performed by virtue of at least two analog-to-digital converters determining the same physical measured variable and at least one calibration factor being determined on the basis of the deviation of the determined physical measured variable.

By way of example, with switch S1 closed, that is to say with reference current Iref applied, the third multiplexer V-MUX and the second multiplexer T-MUX are switched such that the third analog-to-digital converter V-ADC and the second analog-to-digital converter T-ADC respectively determine the voltage at the voltage tapping point between the reference sub-resistor Rref1 and the reference sub-resistor Rref2. A calibration factor for the second analog-to-digital converter T-ADC is determined on the basis of the voltages determined in each case.

As an alternative, in a fifth measuring interval, in which the switch S1 is open, the third multiplexer V-MUX and the second multiplexer T-MUX are switched such that the third analog-to-digital converter V-ADC and the second analog-to-digital converter T-ADC each record the voltage potential of the battery Vbat+. A voltage divider preferably divides the voltage potential of the battery Vbat+ with a known division ratio in order to adapt the voltage potential of the battery Vbat+ to the measuring range of the analog-to-digital converter T-ADC. A calibration factor for the second analog-to-digital converter T-ADC is determined on the basis of the voltage potential Vbat determined in each case. In this alternative advantageous refinement, the measurement of the voltage potential of the battery does not have to be interrupted.

The steps of the method that are described above may be carried out in the stated order. However, they may also be carried out in a different order. In one of its embodiments, for example with a specific combination of steps, the method according to an aspect of the invention may be carried out in such a way that no further steps are carried out. However, in principle, further steps may also be carried out, even steps of a kind which have not been mentioned.

Any desired subsets of the circuits that are shown may be populated with discrete components on a printed circuit board, for example, or integrated in a semiconductor device. In addition, the discrete circuit or the semiconductor module may have further devices, for example temperature sensors, in particular for measuring the temperature, at least one of the resistors Rref, R1, R2, ..., Rn, voltage sensors, in particular for measuring battery voltages, communication interfaces, devices for regulating the current sources C1, C2, further current sources, clock generators, volatile and/or non-volatile data memories, in particular for storing calibration data relating to the current measurement device, for example a value of Rref determined in the manufacturing final test or a temperature coefficient of Rref, microprocessors, in particular for calculating physical variables of the battery or for calculating temperature models, in particular for calculating the battery temperature, the ambient temperature of the device or for calculating a temperature of one or more of the resistors Rref, R1, ..., Rz that are used.

The entire arrangement or any desired subset of the device may for example be installed in a plastic or metal housing with or without an integrated connector or may be injection-molded with a plastic.

The entire arrangement or any desired subset of said devices, in particular the measuring resistors or shunt resistors R1, ..., Rz, may be integrated into a battery pole terminal, into a cable shoe, into a battery cable or into a battery.

The measuring resistor elements R1, R2 may be part of a single-piece load resistor unit, for example areas on a load resistor.

The load resistor unit consisting of the single-piece load resistor, as well as the battery terminal and the ground connection, may also be formed in a single piece, in particular as a stamped and bent part.

The circuit may furthermore contain one or more choppers for the voltages tapped off at the resistors Rref, R1, ..., Rz.

The circuit may furthermore contain one or more sample-and-hold elements or other analog buffers for voltages tapped off at the resistors Rref, R1, ..., Rz or voltages tapped off or amplified there.

The claims that are part of the application do not represent any renouncement of the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim available on the filing date or may be a subcombination of a claim available on the filing date that is limited by further features. Claims or combinations of features of this kind requiring rewording are intended to be understood to be covered by the disclosure of this application as well.

It should further be pointed out that configurations, features and variants of aspects of the invention that are described in the various embodiments or exemplary embodiments and/or shown in the figures are combinable with one another in any way. Single or multiple features may be interchanged with one another in any way. Combinations of features arising therefrom are intended to be understood to be covered by the disclosure of this application as well.

Back-references in dependent claims are not intended to be understood as dispensing with the attainment of independent substantive protection for the features of the back-referenced dependent claims. These features may also be combined with other features in any way.

Features that are disclosed only in the description or features that are disclosed in the description or in a claim only in conjunction with other features may fundamentally be of independent significance essential to aspects of the invention. They may therefore also be individually included in claims for the purpose of distinction from the prior art.

For the purpose of better readability, some reference signs are represented in abbreviated form in the claims. The first operating parameter is thus denoted a, the second operating parameter is denoted R*g and the gain factor is denoted g. The indices used in the above description were dispensed with in this case.

The invention claimed is:

1. A method for operating a battery sensor, comprising:
a first battery sensor connection and a second battery sensor connection, for connection to a battery, and a load current connection,
a current measurement device for recording a load current, with a first measuring resistor element and a second measuring resistor element, wherein the first measuring resistor element and the second measuring resistor element are connected in series between the load current connection and the second battery sensor connection, and
a reference current circuit with at least one reference resistor, wherein the reference resistor is in contact with the first battery sensor connection and a contact point provided between the measuring resistor elements,
wherein an electrical resistance of the first measuring resistor element is determined by:
switching on a reference current and recording voltage drops across the first measuring resistor element and the second measuring resistor element and battery voltage,
determining the reference current from a quotient of the battery voltage and an electrical resistance of the reference resistor, and
determining the electrical resistance of the first measuring resistor element from the recorded voltage drops, the reference current and at least one correction factor that characterizes the relationship between the electrical resistance of the first measuring resistor element and an electrical resistance of the second measuring resistor element.

2. The method as claimed in claim 1, wherein the load current is determined by:
switching off the reference current, and
recording at least the voltage drop across the first measuring resistor element.

3. The method as claimed in claim 2, wherein battery state is determined by:
recording the battery voltage,
determining the load current from the voltage drop across the first measuring resistor element, and
recording a battery parameter using a sensor.

4. The method as claimed in claim 2, wherein a battery state is determined by:
recording the battery voltage,
determining the load current from the voltage drop across the first measuring resistor element, and
recording a temperature of a battery parameter using a temperature sensor.

5. The method as claimed in claim 1, wherein the at least one correction factor is determined from the voltage drops and/or profiles of the voltage drops of the load current across the first measuring resistor element and the second measuring resistor element when the reference current is switched off.

6. The method as claimed in claim 1, further comprising:
determining the electrical resistance of the first measuring resistor element, determining the load current,
determining a battery state, and/or
determining a battery parameter using a sensor are repeated alternately.

7. The method as claimed in claim 1, wherein the reference resistor has at least a first reference sub-resistor and a second reference sub-resistor, and the reference resistance is determined by:
connecting the reference current to the group of measuring resistors,
recording a voltage at a voltage tapping point between the reference sub-resistors,
recording the battery voltage,
determining a division ratio from the recorded voltage and the recorded battery voltage,
determining an electrical resistance of the second reference sub-resistor from the division ratio and a known electrical resistance of the first reference sub-resistor.

8. The method as claimed in claim 1, wherein the battery voltage, the voltage drops and battery parameters are recorded using three analog-to-digital converters, wherein a first analog-to-digital converter for recording the voltage drop across the first measuring resistor element, a second analog-to-digital converter for selectively recording the voltage drop across the second measuring resistor element or the battery parameter of at least one sensor and a third analog-to-digital converter for recording the battery voltage are provided.

9. The method as claimed in claim 8, wherein a calibration factor of the second or the third analog-to-digital converter is temporarily determined by applying the same voltage, the same voltage drop and/or the same parameter of a sensor to the second and the third analog-to-digital converter.

10. The method as claimed in claim 9, wherein the battery voltage is recorded simultaneously using the second analog-to-digital converter and the third analog-to-digital converter.

11. The method as claimed in claim 9, wherein a voltage applied at a voltage tapping point between a first reference sub-resistor and a second reference sub-resistor of the reference resistor is recorded using the second analog-to-digital converter and the third analog-to-digital converter.

12. A battery sensor for determining a battery state of a battery, comprising:
a first battery sensor connection and a second battery sensor connection, for connection to the battery, and a load current connection,
a voltage measurement device for recording a voltage at the first battery sensor connection,
a current measurement device for recording a load current, with a first measuring resistor element and a second measuring resistor element, wherein the first measuring resistor element and the second measuring resistor element are connected in series between the load current connection and the second battery sensor connection, and wherein a first and a second voltage measurement apparatus for recording the respective voltage drop across the first and the second measuring resistor element are provided,
a reference current circuit with at least one reference resistor, wherein the at least one reference resistor is in contact with the first battery sensor connection and a contact point provided between the measuring resistor elements, and
a controller for determining the load current and/or a battery state, by way of a method as claimed in claim 1.

13. The battery sensor as claimed in claim 12, wherein the voltage measurement device and/or the first and the second voltage measurement apparatuses have an analog-to-digital converter.

14. The battery sensor as claimed in claim 13, wherein at least one sensor for recording a battery parameter is provided and a changeover switch for switching between a signal of the voltage measurement device and a signal of the sensor is assigned to the second voltage measurement apparatus, and wherein the changeover switch is provided upstream of an analog-to-digital converter of the second voltage measurement apparatus.

15. The battery sensor as claimed in claim 12, wherein at least one sensor for recording a battery parameter is provided and a changeover switch for switching between a signal of the voltage measurement device and a signal of the sensor is assigned to the second voltage measurement apparatus, and wherein the changeover switch is provided upstream of an analog-to-digital converter of the second voltage measurement apparatus.

16. The battery sensor as claimed in claim 12, wherein the reference resistor has at least two reference resistor elements arranged in series, wherein a voltage tapping point is provided between the reference resistor elements, wherein the voltage measurement device is assigned a changeover switch for selectively recording the battery voltage or the voltage present at the voltage tapping point, wherein the changeover switch is provided upstream of an analog-to-digital converter of the voltage measurement device and/or wherein the second voltage measurement apparatus is assigned a changeover switch for selectively recording the voltage drop across the second measuring resistor element and the voltage present at the voltage tapping point, wherein the changeover switch is provided upstream of an analog-to-digital converter of the second voltage measurement apparatus.

17. The battery sensor as claimed in claim 12, wherein a voltage divider for the battery voltage is provided and the second voltage measurement apparatus is assigned a changeover switch for selectively recording the voltage drop across the second measuring resistor element and the battery voltage present at the first battery sensor connection, wherein the changeover switch is provided upstream of an analog-to-digital converter of the second voltage measurement apparatus.

* * * * *